(12) United States Patent
Lam et al.

(10) Patent No.: US 7,078,792 B2
(45) Date of Patent: Jul. 18, 2006

(54) UNIVERSAL INTERCONNECT DIE

(75) Inventors: Ken M. Lam, Colorado Springs, CO (US); Julius A. Kovats, Manitou Springs, CO (US)

(73) Assignee: Atmel Corporation, San Jose, CA (US)

( * ) Notice: Subject to any disclaimer, the term of this patent is extended or adjusted under 35 U.S.C. 154(b) by 0 days.

(21) Appl. No.: 10/836,369

(22) Filed: Apr. 30, 2004

(65) Prior Publication Data

US 2005/0253278 A1 Nov. 17, 2005

(51) Int. Cl.
*H01L 23/02* (2006.01)
(52) U.S. Cl. ............... 257/686; 257/690; 257/786
(58) Field of Classification Search ........... 257/666, 257/786, 690–691, 693
See application file for complete search history.

(56) References Cited

U.S. PATENT DOCUMENTS

| | | | |
|---|---|---|---|
| 6,249,047 B1 * | 6/2001 | Corisis | 257/691 |
| 6,376,914 B1 | 4/2002 | Kovats et al. | 257/777 |
| 6,384,476 B1 * | 5/2002 | Takeuchi | 257/691 |
| 6,511,901 B1 | 1/2003 | Lam et al. | 438/612 |
| 6,770,963 B1 * | 8/2004 | Wu | 257/691 |
| 6,798,056 B1 * | 9/2004 | Matsuura et al. | 257/686 |
| 6,812,557 B1 * | 11/2004 | Matsuo et al. | 257/686 |
| 2002/0027280 A1 * | 3/2002 | Corisis et al. | 257/692 |
| 2003/0006498 A1 * | 1/2003 | Hirayama | 257/691 |
| 2005/0173793 A1 * | 8/2005 | Rohrmoser et al. | 257/725 |

* cited by examiner

*Primary Examiner*—Phat X. Cao
*Assistant Examiner*—Theresa T. Doan
(74) *Attorney, Agent, or Firm*—Schneck & Schneck; Thomas Schneck

(57) ABSTRACT

A device for electrically interconnecting one or more semiconductor devices to provide for flexibility in wiring and preventing long or shorted leads and methods for fabricating and using same. The device has a substrate with a plurality of substantially concentric electrically-conductive paths, each of the plurality of electrically-conductive paths being electrically isolated from each other and formed on a first surface of the substrate. At least one of the plurality of electrically-conductive paths is arranged concentrically so as to substantially span a width of the first surface of the substrate. A plurality of bonding pads is electrically coupled to each of the electrically-conductive paths. The plurality of bonding pads is coupled to one of the electrically-conductive paths and is electrically isolated from bonding pads located on any other electrically-conductive path. The entire interconnect device may be mounted in a standard leadframe product.

40 Claims, 6 Drawing Sheets

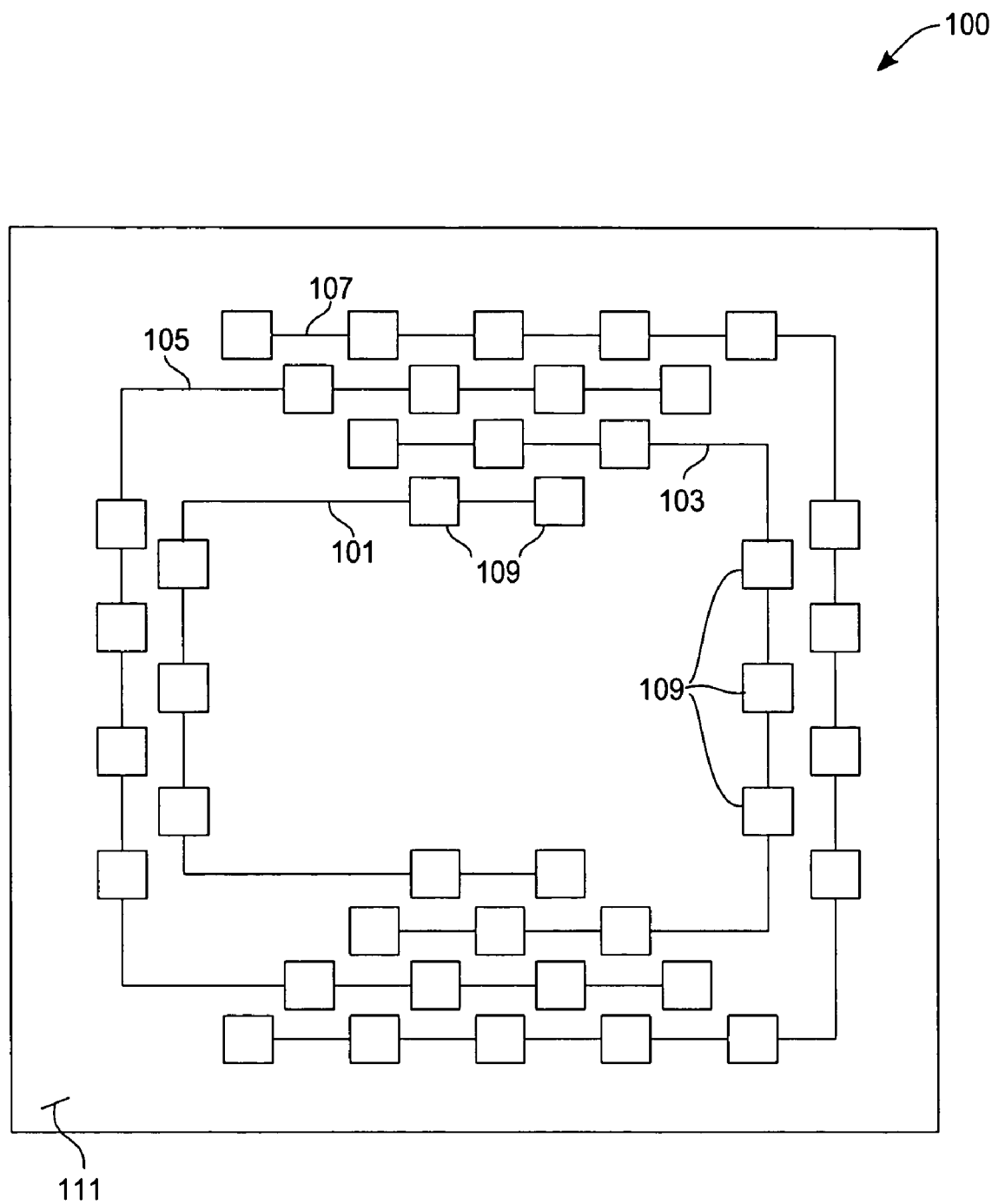
Fig._1

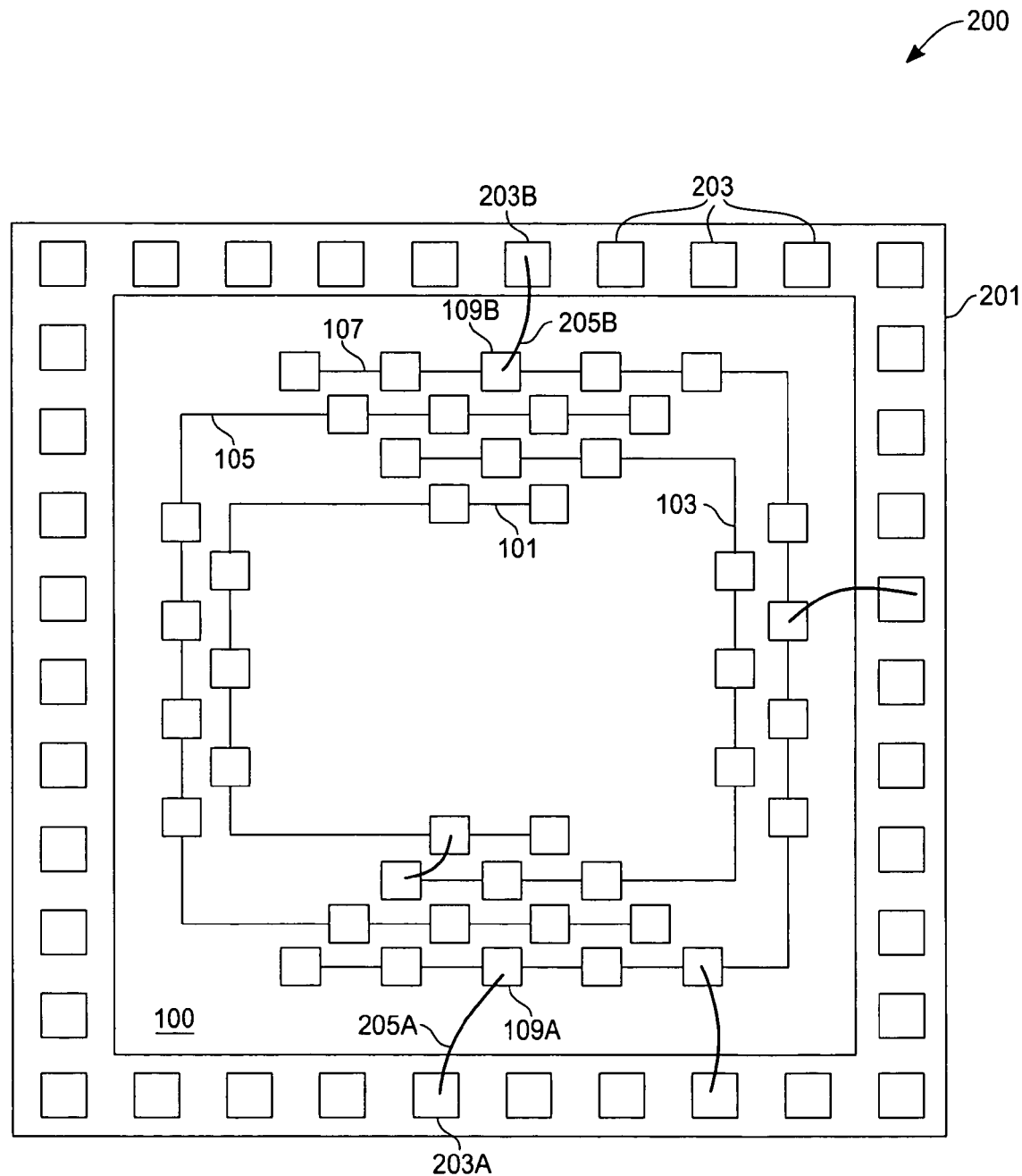
Fig._2

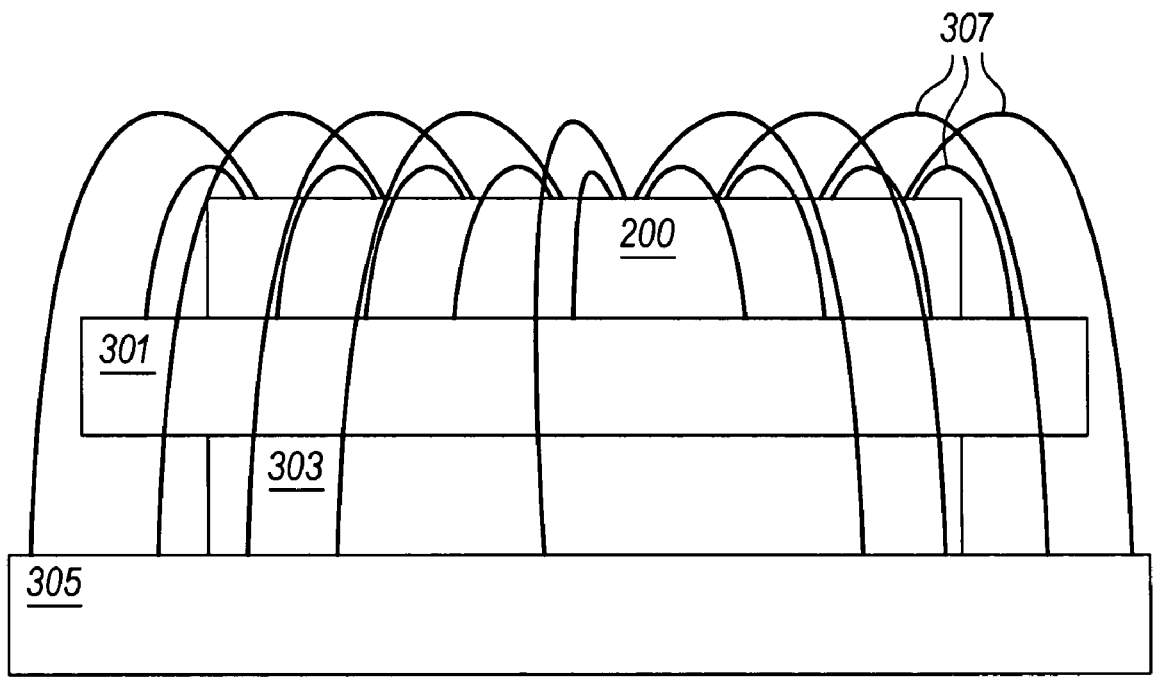
Fig._3

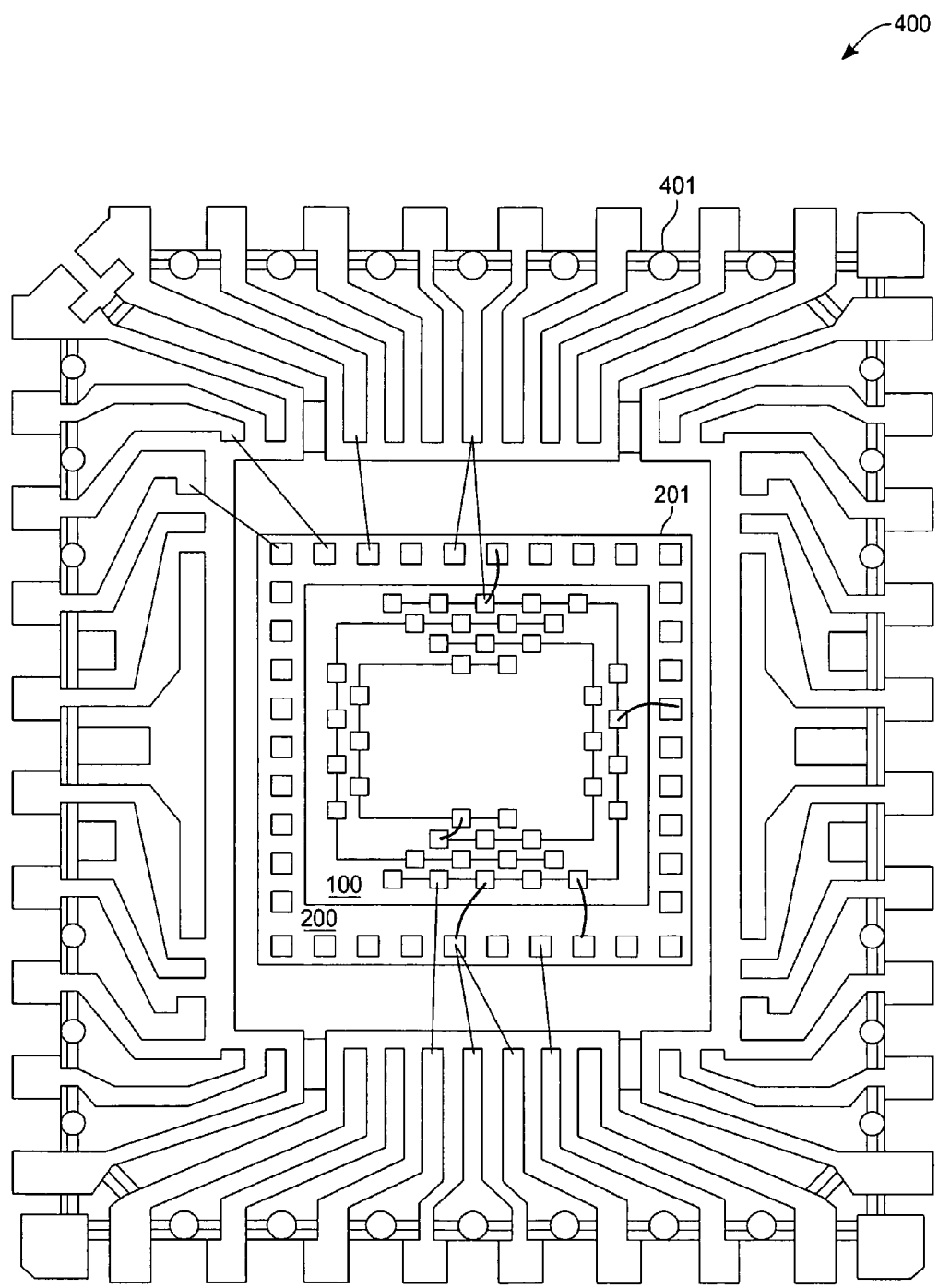
Fig._4

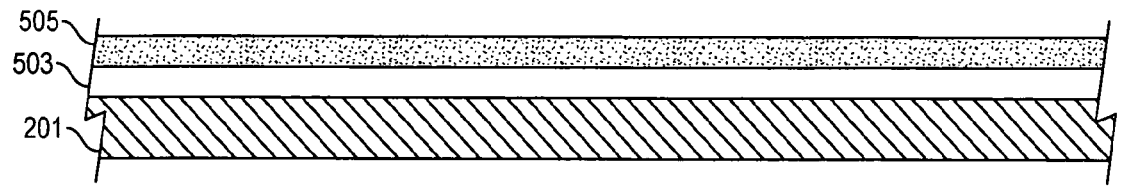
Fig._5A
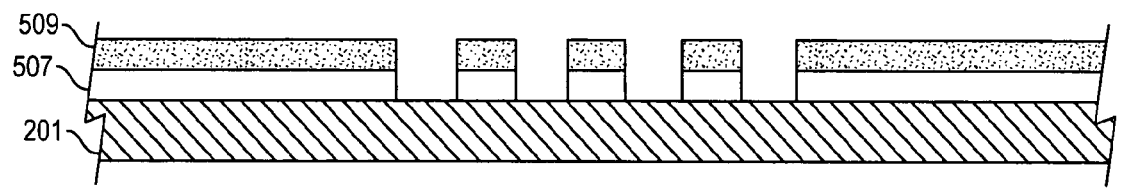
Fig._5B
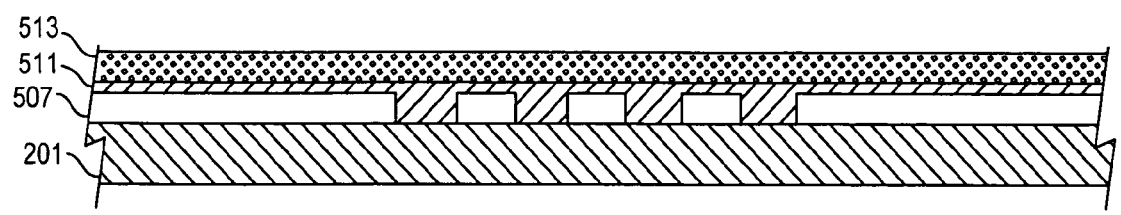
Fig._5C

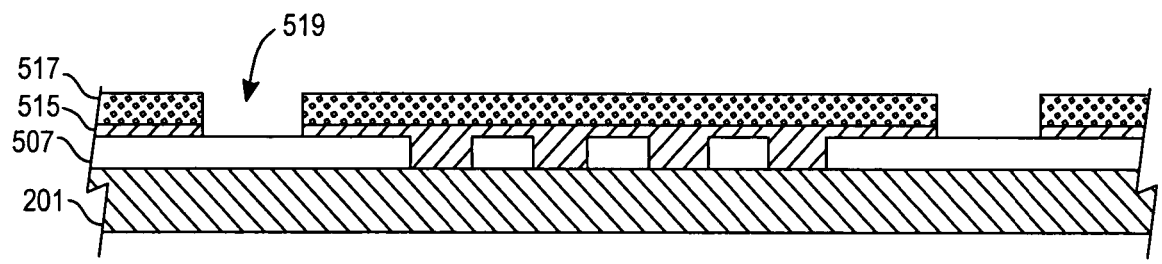
Fig._5D
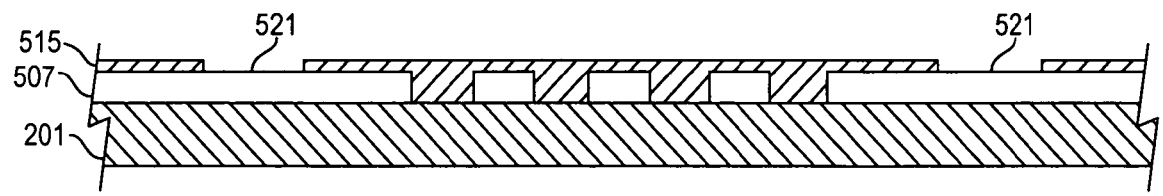
Fig._5E

UNIVERSAL INTERCONNECT DIE

TECHNICAL FIELD

The present invention relates to an interconnect die for a semiconductor integrated circuit. More particularly, the present invention relates to a universal interconnect die that allows for flexibility in wiring integrated circuits.

BACKGROUND ART

Design and manufacturing of semiconductor devices requires cooperative application of a number of diverse technologies. On a macro-scale, a number of these technologies are aimed at first creating the semiconductor devices. Another group of technical disciplines is aimed at packaging the devices. As devices become more complex and need to be integrated with additional devices and other apparatus, a universal interconnection scheme becomes more difficult.

Typically, a semiconductor device has fixed input/output (I/O) lines and interconnection with an external package can be difficult. This difficulty may lead to a redesign of an entire integrated circuit to avoid long lead wires from the device to the package. Additionally, any lead lines that cross over each other have a potential for developing an electrical short. Therefore, the interconnection of semiconductor devices with device packages is a major challenge in the art.

The process of packaging semiconductor devices typically starts with a substrate that is, for example, ceramic, plastic, or a metal leadframe. The devices are mounted on the surface of the substrate and layers of interconnect lines and vias are formed that connect the devices to surrounding circuitry. Many different packaging approaches are known and have been used for mounting and interconnecting semiconductor devices, such as Dual-In-Line Packages (DIP), Pin Grid Arrays (PGA), Plastic Leaded Chip Carriers (PLCC) and Quad Flat Packages (QFP). Multi-layer structures have further been used to connect physically closely spaced integrated circuits with each other. The chip wiring contains layers of interconnect metal that are interconnected with interconnect vias, layers of dielectric (such as polyimide), or insulating layers separate metal layers that make up the interconnect network and the vias and contact points that establish connections between the interconnect networks. The design of overlying and closely spaced interconnect lines is subject to strict rules of design that are aimed at improving package performance despite a high density packaging that may be used. For example, electrical interference between adjacent lines is minimized or avoided by creating interconnect lines for primary signals that intersect under 90 degree angles.

The active component or device integration and densification process in integrated circuits has motivated a continuous and ongoing migration of interconnect wiring and connections from boards, cards, and multichip modules to the chip itself. A surface of the chip, with its multilayer wiring, has become a microcosm of the conductor and insulator configurations that were common on previous multilayer printed-circuit boards and multilayer ceramic packages. A logic chip with 700 circuits and three layers of wiring has approximately 5 m of aluminum wiring on a chip less than 5 mm square. There are over 17,000 via connections from level to level through a micron-thick insulator film of $SiO_2$. Yet, the conductor capacity in the chip greatly lags behind the densification of the silicon devices. Most of the area of the chip (approximately two-thirds), still serves as a platform for wiring.

Therefore, what is needed is a is way to provide for flexible wiring techniques between semiconductor devices and packages while avoiding problems associated with long lead lines and potentially shorted devices. Additionally, universality of the package, where the package can be used to package a variety of different semiconductor devices, is desirable.

DISCLOSURE OF THE INVENTION

The present invention is a device for electrically interconnecting one or more semiconductor devices to provide for flexibility in wiring and preventing long or shorted leads. The present invention is also a method for fabricating the device and using the same.

The device has a substrate with a plurality of substantially concentric electrically-conductive paths, each of the plurality of electrically-conductive paths being electrically isolated from each other and formed on a first surface of the substrate. At least one of the plurality of electrically-conductive paths is arranged concentrically so as to substantially span a width of the first surface of the substrate. A plurality of bonding pads is electrically coupled to each of the electrically-conductive paths. The plurality of bonding pads is coupled to one of the electrically-conductive paths and is electrically isolated from bonding pads located on any other electrically-conductive path. Jumper wires may then be used to interconnect various bonding pads, and hence, different electrically-conductive paths. This "jumpering" allows signals to be carried to a distal part of the device without relying on long wire leads and eliminating or greatly minimizing a possibility of electrical shorts. Jumpering also allows for flexibility in wiring arrangements and permits other devices (e.g., active or passive discrete electrical components) to be added to the integrated circuit, thereby providing additional flexibility in electrical design. The entire interconnect device may then be mounted in a standard leadframe product.

The present invention is also a method of manufacturing an integrated circuit package. The method includes producing a plurality of electrically-conductive paths in concentric patterns on a first surface of a substrate with at least one of the plurality of electrically-conductive paths substantially covering a width of the first surface of the substrate. The process steps to produce the plurality of electrically-conductive paths include (i) depositing a conductive metal onto the substrate;
(ii) patterning and etching the conductive metal to produce the plurality of electrically-conductive paths; and
(iii) depositing a passivation layer over the plurality of electrically-conductive paths and any exposed areas of the first surface of the substrate.

Additionally, a plurality of bonding pads are produced and electrically coupled to each of the electrically-conductive paths. The plurality of bonding pads coupled to one of the electrically-conductive paths is electrically isolated from bonding pads located on any other electrically-conductive path. The process steps to produce the plurality of bonding pads includes (i) coating the passivation layer with photoresist;
(ii) exposing, developing, and etching the photoresist in a pattern to locate the first plurality of bonding pads; and
(iii) etching the exposed passivation layer to expose a portion of the conductive metal, thereby forming bonding pads.

The substrate is mounted into a leadframe package (e.g., a 32 pin plastic leaded chip carrier (PLCC)). The PLCC package is then electrically coupled to the substrate by a plurality of lead wires using standard lead bonding practices.

The present invention is also a method of interconnecting a semiconductor device to an interconnect die by placing the interconnect die in proximity with a semiconductor device, bonding a plurality of lead wires from the semiconductor device to the interconnect die, and coupling lead wires between various interconnect die bonding pads.

BRIEF DESCRIPTION OF THE DRAWINGS

FIG. 1 is an exemplary layout of bonding pads and electrically-conductive paths of the present invention, forming a universal interconnect die.

FIG. 2 is an exemplary embodiment the universal interconnect die of FIG. 1 mounted on a secondary die, allowing for external bonding pads.

FIG. 3 is a cross-section of the universal interconnect die of FIG. 2 used in a stacked-die configuration.

FIG. 4 is the universal interconnect die of FIG. 2 used in a 32 pin plastic leaded chip carrier package.

FIG. 5A-E are cross-sections after exemplary processing steps for fabricating the universal interconnect die of FIG. 2.

MODES FOR CARRYING OUT THE INVENTION

The present invention will now be described with reference to preferred embodiments thereof. With reference to FIG. 1, a bonding pad interconnection scheme includes a plurality of substantially concentric electrically-conductive coupling paths 101, 103, 105, 107 thus providing various electrical connection paths. Each electrically-conductive coupling path is arranged in a "tier" or series of paths increasing in size with the first tier being the innermost path. Each electrically-conductive coupling path further has a plurality of bonding sites. For example, a first electrically-conductive coupling path 101, in this exemplary embodiment, has seven first-tier bonding pads 109; a second electrically-conductive coupling path 103 has nine second-tier bonding pads, and so on. As a skilled artisan will quickly recognize, a greatly increased number of electrically-conductive bonding pads may be realized by either increasing a number of electrical connection paths and/or closer spacing of bonding sites. The bonding pad interconnection scheme is fabricated on a substrate 111, forming a universal interconnect die 100. The substrate 111 may be a die sawn from a semiconductor wafer, for example, a silicon wafer. The substrate 111 serves as a mechanical support base on which the bonding pad interconnection scheme may be fabricated. Alternatively, a non-contaminating material such as polyimide could readily function as a substitute material for the substrate 111. Using a semiconductor wafer as a support base allows standard semiconductor fabrication techniques to be employed and also reduces concerns for heavy metal and particulate contamination which may accompany non-semiconductor materials.

Turning now to FIG. 2, the universal interconnect die 100 is shown mounted to a secondary substrate 201. The secondary substrate 201 also provides for a plurality of external bonding pads 203. Alternatively, the plurality of external bonding pads 203 could be fabricated directly onto the universal interconnect die 100 by processes described infra.

Also shown in the exemplary embodiment of FIG. 2, a first interconnect 205A allows a first external bonding pad 203A to be electrically coupled to a first fourth-tier bonding pad 109A. A second interconnect 205B allows a second external bonding pad 203B to be electrically coupled to a second fourth-tier bonding pad 109B. Since the first fourth-tier bonding pad 109A and a second fourth-tier bonding pad 109B are electrically connected through the fourth electrically-conductive coupling path 107, the first external bonding pad 203A and the second external bonding pad 203B are now both electrically coupled.

Therefore, any proximate bonding pad 109 may be electrically coupled to any distal bonding pad or external bonding pad through the use of jumper wires. Similarly, any proximate external bonding pad may by electrically coupled to any distal external bonding pad. The present invention thereby allows for extremely complex interconnections while preventing any wires from being unreasonably long or crossing over each other (and possibly shorting).

With reference to FIG. 3, a cross-sectional view of an exemplary stacked-die configuration 300 includes a first semiconductor device die 305, a die spacer 303, a second semiconductor device die, and the universal interconnect die 200. For example, the first semiconductor device die 305 is a flash-memory chip and the second semiconductor die 301 is a cryptographic encoding-decoding chip. The die spacer 303 prevents the first and second semiconductor device dice 305, 301 from coming into direct mechanical or electrical contact with each other and allows space for electrical interconnects, such as wedge-bonding or ball-bonding. Each device die may then be flexibly coupled, electrically, through the use of the universal interconnect die 200 and bonding wires 307. Additionally, discrete active and/or passive components can be added directly to the universal interconnect die 200. Therefore, the universal interconnect die 200 allows for great flexibility in a layout of each device die and further allows great flexibility in interconnectivity between the semiconductor devices.

With reference to FIG. 4, the universal interconnect die 200 is mounted into, for example, a 32 pin plastic leaded chip carrier (PLCC) package. Alternatively, the stacked die configuration 300 or any other combination of semiconductor devices and universal interconnect die 200 may be mounted in the 32 pin PLCC (or any other device package such as a pin grid array (PGA) or quad flat pack (QFP)).

Turning to FIG. 5A-5E, an exemplary fabrication process begins with a layer of photoresist 505, coated over a blanket conductive layer 503 (FIG. 5A). Both layers overlay the substrate 201. In a specific exemplary embodiment, the substrate is a silicon wafer, the blanket conductive layer 503 is aluminum, approximately 800 nanometers (nm) thick, and the photoresist layer 505 is approximately 250 nm–750 nm in thickness. The photoresist layer 505 is then exposed, developed, and etched so as to protect the blanket conductive layer 503 where the electrically-conductive paths 101, 103, 105, 107 are desired. Unprotected areas of the blanket conductive layer are then removed by, for example, wet etching. Alternatively, the electrically-conductive paths 101, 103, 105, 107 may be formed by electroplating (e.g., such as a copper damascene process), or other technique known to one of skill in the art.

With respect to FIG. 5B, a cross-section of the etched photoresist 509 overlaying the electrically-conductive paths 507 is shown. After stripping any remaining etched photoresist 509, a passivation layer 511 (FIG. 5C) is deposited over the electrically-conductive paths 507. The passivation layer is, for example, 1100 nm of a high density plasma oxide followed by a chemical vapor deposited 1000 nm oxy-nitride film.

The passivation layer 511 is then coated with a second photoresist layer 513 (FIG. 5C). The second photoresist layer is exposed, developed, and etched, serving as an etch mask layer 517 (FIG. 5D) for the underlying passivation layer 511. The passivation layer 511 is then etched, through various etching techniques (for example, using a wet etch (e.g., in hydrofluoric, such as contained in a standard buffered oxide etch, or orthophosphoric acid) or dry etch (e.g., reactive-ion etch (RIE) technique). The etched passivation layer 515 produces vias 519 for producing conductive bond pads. The etch mask layer 517 is then stripped.

FIG. 5E shows an exemplary completed cross-section of the universal interconnect die 200, with exposed conductive bond pads 521. After process steps are completed, the substrate 201 may be diced to provide a plurality of universal interconnect dice 200.

Although the detailed description and drawings describe a universal interconnect die and applications of the same, one skilled in the art will recognize that other embodiments can readily be contemplated without departing from the intended scope of the device described. For example, the substrate 111 is described in terms of a silicon wafer. A skilled artisan will recognize that another type of substrate, such as a thinned quartz photomask blank, or another elemental group IV semiconductor or compound semiconductor (e.g., groups III–V or II–VI) may be selected for substrate 111. Additionally, the fabrication process is merely exemplary. Other techniques and materials (e.g., laminates or ceramics) may be readily employed and still be within a scope of the present invention. Further, other layouts of the electrically-conductive paths, such as multiple layers of electrically-conductive paths separated by a dielectric layer, may be realized and also fall within a scope of the present invention.

What is claimed is:

1. An interconnect device comprising:
   an interconnect die having no active components and configured to mount to an integrated circuit, the interconnect die including:
   a plurality of substantially concentric electrically-conductive paths, each of the plurality of electrically-conductive paths being electrically isolated from each other and formed on a first surface of the interconnect die, at least one of the plurality of electrically-conductive paths arranged concentrically so as to substantially span a width of the first surface of the interconnect die; and
   a first plurality of bonding pads electrically coupled to and distributed along each of the electrically-conductive paths, the first plurality of bonding pads coupled to one of the electrically-conductive paths being electrically isolated from bonding pads located on any other electrically-conductive path.

2. The interconnect device of claim 1, further comprising a second plurality of bonding pads, the second plurality of bonding pads being located on a periphery of the first surface of the interconnect die, the second plurality of bonding pads being electrically isolated from each other and from the first plurality of bonding pads.

3. The interconnect device of claim 2 wherein the first and second plurality of bonding pads are aluminum.

4. The interconnect device of claim 1 wherein the interconnect die is a die from a silicon wafer.

5. The interconnect device of claim 1 wherein the electrically-conductive paths are aluminum.

6. The interconnect device of claim 1 wherein the electrically-conductive paths are copper.

7. The interconnect device of claim 1 wherein the first and second plurality of bonding pads are copper.

8. The interconnect device of claim 1 wherein the interconnect die is configured to be mounted in proximity to a semiconductor device, the interconnect die being further configured to electrically couple to the semiconductor device.

9. The interconnect device of claim 1 wherein the interconnect device is configured to be mounted in proximity to a plurality of stacked semiconductor devices, the interconnect die being further configured to electrically couple to the semiconductor devices.

10. The interconnect device of claim 1 wherein the interconnect device is configured to electrically couple passive electrical components between at least two of the first plurality of bonding pads.

11. The interconnect device of claim 1 wherein the interconnect device is configured to electrically couple active electrical components between at least two of the first plurality of bonding pads.

12. The interconnect device of claim 1 wherein the interconnect device is configured to a particular package type by adding interconnects between at least two of the first plurality of bonding pads.

13. An integrated circuit package, comprising:
   an interconnect die having no active components and configured to mount an integrated circuit, the interconnect die including
   (i) a substrate;
   (ii) a plurality of substantially concentric electrically-conductive paths, each of the plurality of electrically-conductive paths being electrically isolated from each other and formed on a first surface of the substrate, at least one of the plurality of the electrically-conductive paths arranged concentrically so as to substantially span a width of the first surface of the substrate;
   (iii) a first plurality of bonding pads electrically coupled to and distributed along each of the electrically-conductive paths, the first plurality of bonding pads coupled to one of the electrically-conductive paths being electrically isolated from bonding pads located on any other electrically-conductive path; and
   a leadframe package, the leadframe package having a plurality of metal leads, each of the plurality of metal leads having a first end and a second end, the second end being configured to be used as a package lead to electrically communicate external to the package, at least a portion of the first end electrically coupled to the interconnect die.

14. The integrated circuit package of claim 13, further comprising a second plurality of bonding pads on the interconnect die, the second plurality of bonding pads being located on a periphery of the first surface of the substrate, the second plurality of bonding pads being electrically isolated from each other and from the first plurality of bonding pads.

15. The integrated circuit package of claim 13 wherein the interconnect die is configured to be mounted on top of a semiconductor device, the interconnect die being further configured to electrically couple to the semiconductor device.

16. The integrated circuit package of claim 13 wherein the interconnect die is configured to be mounted on top of a plurality of stacked semiconductor devices, the interconnect die being further configured to electrically couple to the semiconductor devices.

17. The interconnect die of claim 13 wherein the interconnect die is configured to electrically couple passive electrical components between at least two of the first plurality of bonding pads.

18. The interconnect die of claim 13 wherein the interconnect die is configured to electrically couple active electrical components between at least two of the first plurality of bonding pads.

19. The interconnect die of claim 13 wherein the interconnect die is configured to a particular package type by adding interconnects between at least two of the first plurality of bonding pads.

20. An interconnect device comprising:
an interconnect die having no active components and configured to mount to a first integrated circuit, the interconnect die also configured to mount to either a second integrated circuit or a second interconnect die, the interconnect die including:
a plurality of substantially concentric electrically-conductive paths, each of the plurality of electrically-conductive paths being electrically isolated from each other and formed on a first surface of the interconnect die, at least one of the plurality of electrically-conductive paths arranged concentrically so as to substantially span a width of the first surface of the interconnect die; and
a first plurality of bonding pads electrically coupled to and distributed along each of the electrically-conductive paths, the first plurality of bonding pads coupled to one of the electrically-conductive paths being electrically isolated from bonding pads located on any other electrically-conductive path.

21. The interconnect die of claim 20, further comprising a second plurality of bonding pads, the second plurality of bonding pads being located on a periphery of the first surface of the interconnect die, the second plurality of bonding pads being electrically isolated from each other and from the first plurality of bonding pads.

22. The interconnect device of claim 21 wherein the first and second plurality of bonding pads are aluminum.

23. The interconnect device of claim 20 wherein the interconnect device is a die from a silicon wafer.

24. The interconnect device of claim 20 wherein the electrically-conductive paths are aluminum.

25. The interconnect device of claim 20 wherein the electrically-conductive paths are copper.

26. The interconnect device of claim 20 wherein the first and second plurality of bonding pads are copper.

27. The interconnect device of claim 20 wherein the interconnect device is configured to be electrically coupled to the first integrated circuit.

28. The interconnect device of claim 20 wherein the interconnect die is configured to electrically couple passive electrical components between at least two of the first plurality of bonding pads.

29. The interconnect device of claim 20 wherein the interconnect die is configured to electrically couple active electrical components between at least two of the first plurality of bonding pads.

30. An interconnect device comprising:
an interconnect die including:
a plurality of substantially concentric electrically-conductive paths, each of the plurality of electrically-conductive paths being electrically isolated from each other and formed on a first surface of the interconnect die, at least one of the plurality of electrically-conductive paths arranged concentrically so as to substantially span a width of the first surface of the interconnect die; and
a plurality of bonding pads electrically coupled to and distributed along each of the electrically conductive paths, a first plurality of bonding pads coupled to one of the electrically-conductive paths being electrically isolated from bonding pads located on any other electrically-conductive path, a second plurality of bonding pads being located on a periphery of the first surface of the interconnect die, at least one of the first plurality of bonding pads electrically coupled to at least one of the second plurality of bonding pads by an interconnect.

31. The interconnect device of claim 30 wherein the interconnect die is a die from a silicon wafer.

32. The interconnect device of claim 30 wherein the electrically-conductive paths are aluminum.

33. The interconnect device of claim 30 wherein the electrically-conductive paths are copper.

34. The interconnect device of claim 30 wherein the first and second plurality of bonding pads are aluminum.

35. The interconnect device of claim 30 wherein the interconnect die is configured to be mounted in proximity to a semiconductor device, the interconnect die being further configured to electrically couple to the semiconductor device.

36. The interconnect device of claim 30 wherein the interconnect device is configured to be mounted in proximity to a plurality of stacked semiconductor devices, the interconnect die being further configured to electrically couple to the semiconductor devices.

37. The interconnect device of claim 30 wherein the interconnect device is configured to electrically couple passive electrical components between at least two of the first plurality of bonding pads.

38. The interconnect device of claim 30 wherein the interconnect device is configured to electrically couple active components between at least two of the first plurality of the first plurality of bonding pads.

39. The interconnect device of claim 30 wherein the interconnect device is configured to electrically couple active electrical components between at least two of the first plurality of bonding pads.

40. The interconnect device of claim 30 further comprising the interconnect device incorporated into an integrated circuit package, the integrated circuit package including a leadframe package, the leadframe package having a plurality of metal leads, each of the plurality of metal leads having a first end and a second end, the second end being configured to be used as a package lead to electrically communicate external to the package, at least a portion of the first end electrically coupled to the interconnect die.

* * * * *